(12) United States Patent
Ozawa et al.

(10) Patent No.: US 9,123,880 B2
(45) Date of Patent: Sep. 1, 2015

(54) LAMINATED PIEZOELECTRIC ACTUATOR

(71) Applicant: TDK CORPORATION, Chuo-ku, Tokyo (JP)

(72) Inventors: Satoshi Ozawa, Tokyo (JP); Syuuzi Itoh, Tokyo (JP); Haruo Taguchi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 286 days.

(21) Appl. No.: 13/750,517

(22) Filed: Jan. 25, 2013

(65) Prior Publication Data

US 2013/0193810 A1 Aug. 1, 2013

(30) Foreign Application Priority Data

Jan. 27, 2012 (JP) ................. 2012-015681

(51) Int. Cl.
*H01L 41/083* (2006.01)
*H01L 41/047* (2006.01)
*H01L 41/04* (2006.01)

(52) U.S. Cl.
CPC ............ *H01L 41/0471* (2013.01); *H01L 41/04* (2013.01); *H01L 41/083* (2013.01)

(58) Field of Classification Search
CPC .............................. H01L 41/083; H01L 41/08
USPC ........................................................ 310/328
See application file for complete search history.

(56) References Cited

U.S. PATENT DOCUMENTS

| 7,259,504 | B2* | 8/2007 | Schurz et al. ................. 310/365 |
| 7,358,653 | B2 | 4/2008 | Nishimura |
| 7,538,475 | B2* | 5/2009 | Ohmori et al. ................. 310/328 |
| 7,605,520 | B2* | 10/2009 | Schurz et al. .................. 310/328 |
| 7,851,979 | B2* | 12/2010 | Kronberger ................... 310/366 |
| 7,855,490 | B2* | 12/2010 | Praino et al. .................. 310/328 |
| 2006/0055288 | A1* | 3/2006 | Heinzmann et al. .......... 310/364 |
| 2006/0119220 | A1* | 6/2006 | Iwase et al. ................... 310/328 |
| 2007/0124903 | A1* | 6/2007 | Iwase et al. ................... 29/25.35 |
| 2008/0116768 | A1* | 5/2008 | Mochizuki et al. ........... 310/364 |
| 2008/0136293 | A1* | 6/2008 | Mochizuki et al. ........... 310/358 |
| 2009/0000092 | A1 | 1/2009 | Sugg |
| 2010/0019621 | A1* | 1/2010 | Funakubo et al. ........ 310/323.16 |
| 2010/0078505 | A1* | 4/2010 | Kato .............................. 239/546 |
| 2010/0140379 | A1* | 6/2010 | Suzuki et al. ................. 239/569 |
| 2011/0121684 | A1* | 5/2011 | Cooke et al. .................. 310/314 |
| 2011/0181155 | A1* | 7/2011 | Gabl et al. .................... 310/366 |
| 2012/0019107 | A1* | 1/2012 | Gabl et al. .................... 310/363 |
| 2013/0233278 | A1* | 9/2013 | Sato .............................. 123/456 |
| 2013/0248623 | A1* | 9/2013 | Kastl et al. ................. 239/585.1 |
| 2013/0342082 | A1* | 12/2013 | Itoh et al. ...................... 310/366 |

FOREIGN PATENT DOCUMENTS

CN 1717816 A 1/2006
CN 101091263 A 12/2007

(Continued)

*Primary Examiner* — J. San Martin
(74) *Attorney, Agent, or Firm* — Arent Fox LLP

(57) ABSTRACT

A laminated piezoelectric device comprising a device body 10 on which a number of piezoelectric layers 2 and internal electrodes 3, 4 are laminated, external electrodes 5, 6 electrically connected to the internal electrodes 3, 4 and formed on the surface of the device body 10, an insulation layer 7 and a resistance layer 8. The insulation layer 7 covers at least a portion wherein internal electrodes 3, 4 are exposed on the surface of the device body 10, where mechanical displacement is generated by applying voltage. The resistance layer 8 is formed to connect between external electrodes 5, 6 and has a lower electric resistance value than the insulation layer 7.

4 Claims, 6 Drawing Sheets

(56) References Cited

FOREIGN PATENT DOCUMENTS

| DE | 102008041061 | A1 | * | 2/2009 | ............ H01L 41/083 |
| DE | 102010030314 | A1 | * | 12/2010 | |
| FR | 2830129 | A1 | * | 3/2003 | ............ H01L 41/083 |
| WO | WO 2010044396 | A1 | * | 4/2010 | ............ H01L 41/083 |

* cited by examiner

LAMINATED PIEZOELECTRIC ACTUATOR

BACKGROUND OF THE INVENTION

1. Field of the Invention

The present invention relates to a laminated piezoelectric device. More specifically, it relates to a laminated piezoelectric device which enables both prevention of migration and suppression of characteristic deterioration caused by pyroelectric effect.

2. Description of the Related Art

A piezoelectric device is a device mutually converting mechanical displacement and electric displacement by utilizing piezoelectric effect and inverse piezoelectric effect. Such piezoelectric device can be obtained by forming and firing piezoelectric ceramics to make a device body, and then forming electrodes thereon and applying direct electric fields to uniform a direction of spontaneous polarization.

The mechanical displacement obtained by the piezoelectric device is minute. Therefore, the piezoelectric device is used for various products as actuators for the purpose that accurate and precise controls are required, for instance. Specifically, it is used for lens drive, HDD head drive, ink-jet printer head drive, fuel injection valve drive and so on.

Further, when laminating piezoelectric layers to make a laminated piezoelectric device so that a larger displacement can be obtained, edge portions of internal electrodes sandwiching piezoelectric layers are exposed on the surface of the device body. In this case, depending on moisture in the air and the like, migration might cause between internal electrodes having different polarities.

Further, for instance, if such piezoelectric device is applied to portable electronic devices and the like, it will be exposed to temperature changes due to surrounding environmental changes.

If the piezoelectric device is exposed to such temperature changes, polarization caused by pyroelectric effect becomes a problem. Particularly, in the process of lowering of temperature, polarizability decreases since a polarization occurs, opposite to the spontaneous polarization, in the piezoelectric device due to pyroelectric effect. This decreased polarizability does not recover even if the temperature rises again. Therefore, there is a problem that the characteristics deteriorate since the polarizability gradually decreases and a desired displacement cannot be obtained, when the process of lowering of temperature is repeated.

In order to deal with the above problems, the following Reference 1 describes about "a piezoelectric device in which internal electrodes, which are exposed on the sides of laminated piezoelectric body, are covered with exterior materials that prevents migration, and conductive particles are dispersed in the exterior materials".

Furthermore, the following Reference 1 describes that "with this piezoelectric device, it enables to prevent migration by the exterior materials that prevents migration, and also to suppress the decrease of polarizability caused by pyroelectric effect".

[Reference 1] International Publication No. 2007/052599

However, for making a resistance value of the exterior material in the range that could prevent migration and suppress the decrease of polarizability, there is a problem that it is difficult to adjust the resistance value since fluctuation of resistance value of resin composing the exterior materials and the content of conductive particles and the like should be taken into consideration.

When the conductive particles aggregate in the exterior materials, there were problems that the resistance value of the aggregated portion locally decreases and then a short circuit might be caused through the portion. Particularly, this problem becomes prominent as the distance (thickness of piezoelectric layer) between internal electrodes gets smaller.

Further, there is a possibility that it might be unable to adequately prevent moisture permeation if providing several functions to the exterior materials. Furthermore, when a substrate of the piezoelectric devices is cut after firing to obtain individual piezoelectric devices, there were problems that fluctuation of resistance value might be generated since the broken internal electrodes extend along a penetration direction of cutting blades.

SUMMARY OF THE INVENTION

The present invention has been made by considering the above situation, and an object of the present invention is to provide a laminated piezoelectric device which enables to prevent migration and to suppress deterioration in characteristics caused by pyroelectric effect with high reliability. It is a further object of the present invention to provide a laminated piezoelectric device which easily enables a thinning of piezoelectric layer and is highly reliable.

In order to achieve the above objects, a laminated piezoelectric device according to the present invention comprises a device body in which a number of piezoelectric layers, first internal electrodes and second internal electrodes having different polarities from the first internal electrodes are laminated, a first external electrode electrically-connected to the first internal electrodes and formed on the surface of the device body, a second external electrode electrically-connected to the second internal electrodes and formed on the surface of the device body, an insulation layer, and a resistance layer.

In the device body, the insulation layer covers at least a portion wherein the first internal electrodes and the second internal electrodes are exposed on the surface of the device body, where mechanical displacement is generated by applying voltage. Further, a resistance layer is formed to electrically connect the first external electrode and the second external electrode, and has a lower electric resistance value than the insulation layer.

In the present invention, the insulation layer covers at least the above portion of which the internal electrodes are exposed on the surface of the device body. With this, it enables to prevent a moisture intrusion from outside, and also enables to prevent migration generated between internal electrodes having different polarities with high reliability.

Further, in the present invention, a resistance layer, which electrically connects across the external electrodes having different polarities, is formed separately from the insulation layer. The electric resistance value of this resistance layer is lower than the insulation layer. With this, even if a polarization is generated in a direction opposite to a spontaneous polarization when the piezoelectric device according to the present invention is in lowering of temperature, it enables to discharge the generated electrical charge through the resistance layer with high reliability. As a result, with the piezoelectric device according to the present invention, it enables to suppress the decrease of polarizability even if it is placed in an environment in which the temperature change generates.

In this way, it enables to obtain a highly reliable laminated piezoelectric device by preventing migration with insulation layer and suppressing the decrease of polarizability with resistance layer.

Preferably, the resistance layer does not contact with the first internal electrode and the second internal electrode. With this, it enables to completely prevent a short circuit through the resistance layer. The resistance layer may cover a portion of the surface of the insulation layer.

Preferably, the resistance layer covers at least a portion of the first external electrode and/or the second external electrode. With this, the resistance layer and the external electrodes are physically and electrically connected with high reliability. Therefore, a junction of the resistance layer and the external electrode becomes strong by anchor effect. Further, it enables to discharge an electrical charge generated by pyroelectric effect with high reliability.

DESCRIPTION OF THE PREFERRED EMBODIMENTS

The followings are explanation of embodiments of the present invention based on Figures.

Figure 1:
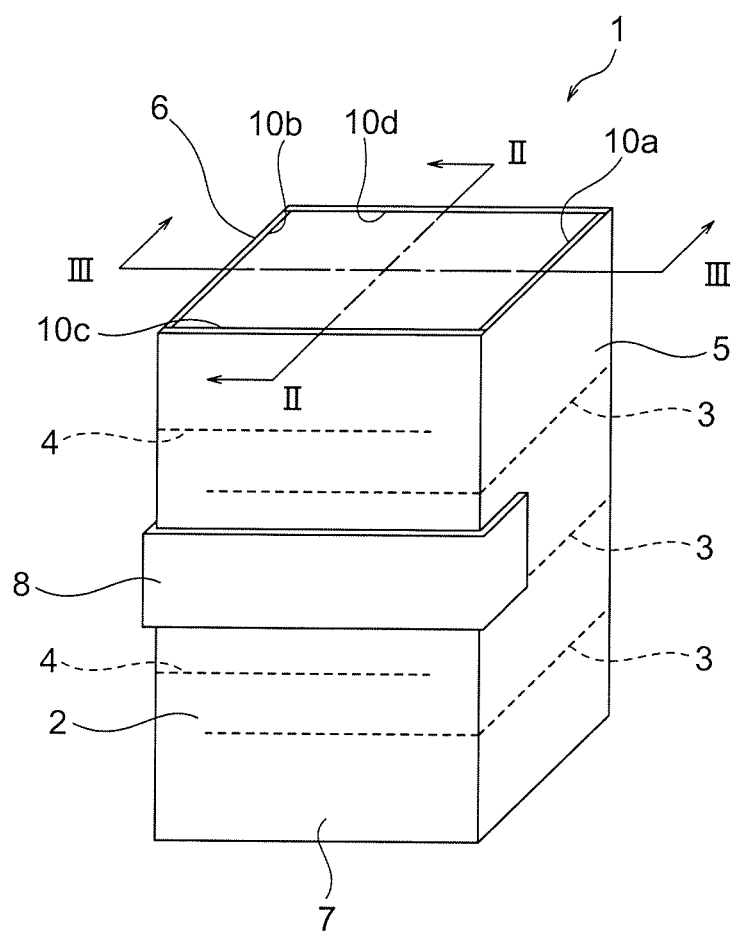
FIG. 1 is a schematic perspective view showing a laminated piezoelectric device according to an embodiment of the present invention.
Figure 2:
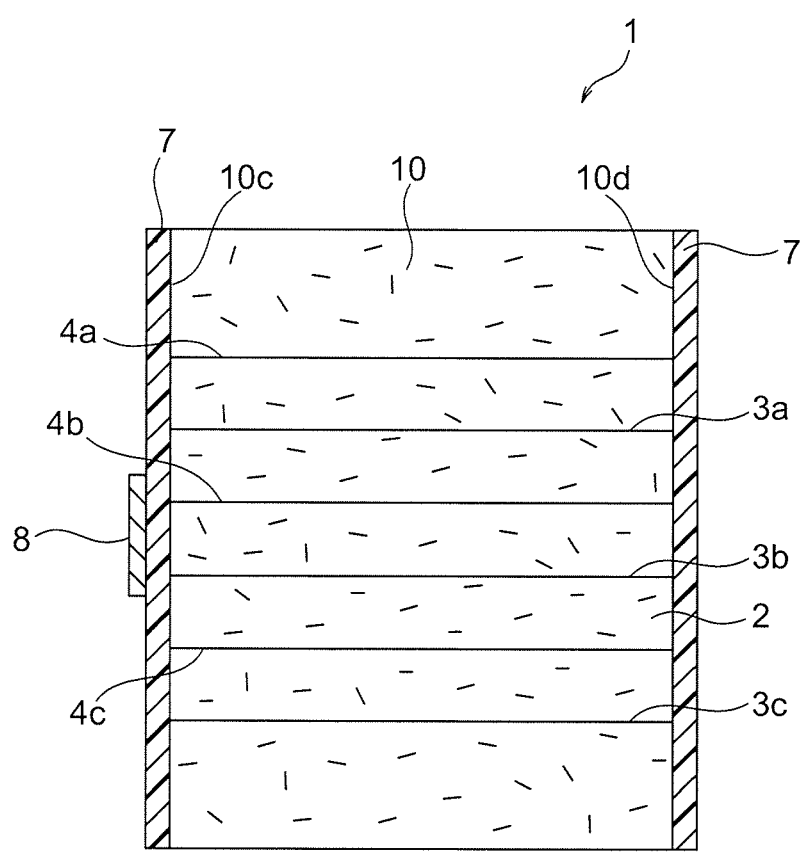
FIG. 2 is a schematic cross-sectional view taken along the line II-II in FIG. 1.

As shown in FIGS. 1 and 2, a laminated piezoelectric device 1 according to the present embodiment comprises a quadrangular-prism-shaped device body 10 having a configuration that piezoelectric layers 2 and internal electrodes 3, 4 are alternately laminated. On the two opposing sides 10a, 10b of this device body 10, external electrodes are formed respectively. Specifically, a first external electrode 5 is formed on the side 10a and a second external electrode 6 having different polarities from the first external electrode 5 is formed on the side 10b.

Further, on the opposing sides 10c, 10d, which is different from the sides 10a, 10b on which external electrodes 5, 6 are formed, edge portions of internal electrodes 3, 4 are exposed and insulation layers 7 are formed respectively thereon. Further, on the surface of the insulation layer 7 of at least either one, the resistance layer 9 is formed to electrically connect the first external electrode 5 and the second external electrode 6.

Figure 3:
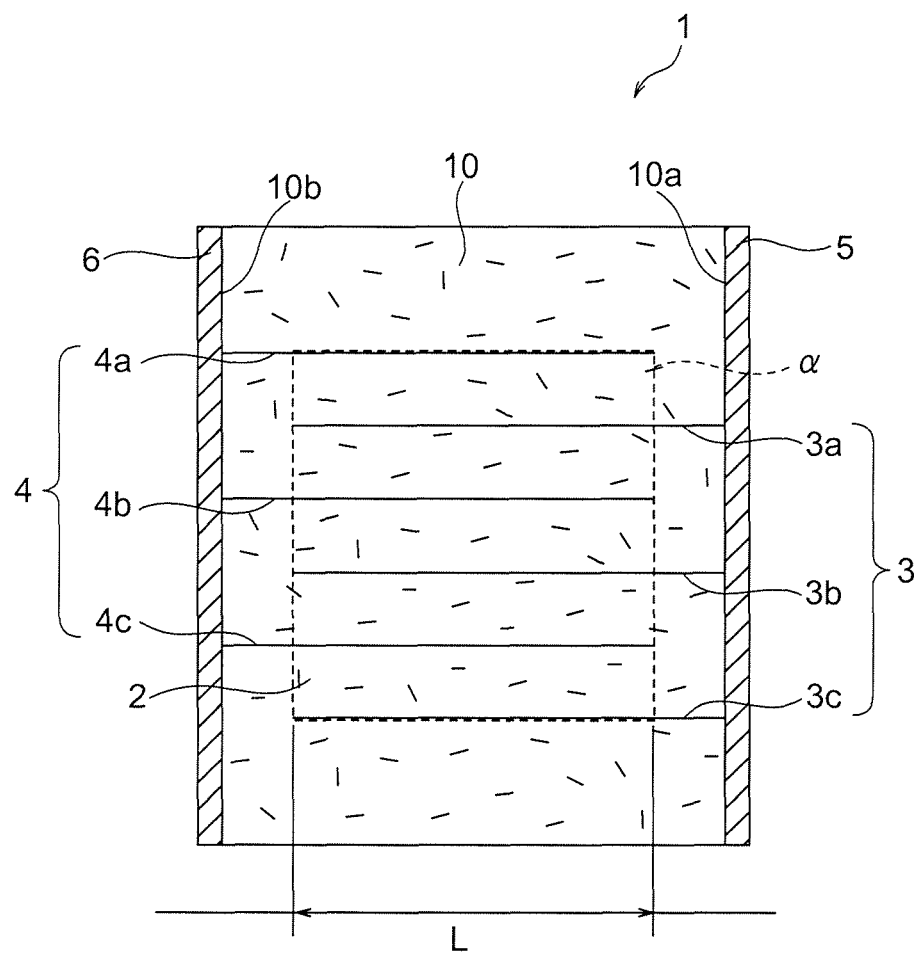
FIG. 3 is a schematic cross-sectional view taken along the line in FIG. 1.

As shown in FIG. 3, in the present embodiment, internal electrodes 3, 4 comprise first internal electrodes 3a to 3c and second internal electrodes 4a to 4c. The first internal electrodes 3a to 3c have one end electrically connected to the inside of the first external electrode 5, and other ends are not connected to the second external electrode 6 although they extend close to the inside of the second external electrode 6. The second internal electrodes 4a to 4c are alternately laminated with the first internal electrodes 3a to 3c via piezoelectric layers 2, and have one end electrically connected to the inside of the second external electrode 6, and other ends are not connected to the first external electrode 6 although they extend close to the inside of the first external electrode 5.

In the present embodiment, in the device body 10, the internal electrodes arranged at the outermost position (outermost internal electrode) are the first internal electrode 3c and the second internal electrode 4a. Further, in figures, although the number of laminated layers of the first internal electrodes 3a to 3c and the second internal electrodes 4a to 4c is 6 layers in total, it is not particularly limited since multiple electrodes are actually more laminated.

In a direction of lamination of this outermost internal electrode, a portion (α portion in FIG. 3) wherein the first internal electrode and the second internal electrode are overlapped is where mechanical displacement is generated when applying voltage to the piezoelectric device (piezoelectric active part). Further, any other portions are where mechanical displacement is not generated even if applying voltage to the piezoelectric device (piezoelectric inactive part).

Insulation Layer 7

In the present embodiment, insulation layers cover at least a portion, included in a piezoelectric active part (α portion), wherein the first internal electrode and the second internal electrode are exposed on the surface of the device body. Specifically, in FIG. 3, the insulation layers 7 cover at least a portion of length L which is an overlap portion α of the first internal electrodes 3a to 3c and the second internal electrodes 4a to 4c.

Migration is likely to be generated as a distance between internal electrodes having different polarities is small. Therefore, it enables to prevent migration by covering the above α portion with the insulation layer 7 and preventing moisture intrusion to α portion wherein the internal electrodes are exposed.

Further, it enables to achieve an effect for migration prevention, since the distance between internal electrodes having different polarities (for instance, the distance between exposed electrodes 4a, 3a) gets larger by covering the above α portion with the insulation layer 7 as shown in FIG. 3, even if the distance between internal electrodes having the identical polarities (for instance, the distance between exposed electrodes 4a, 4b) is relatively small.

In the present embodiment, as shown in FIG. 1, it is preferable that the insulation layer 7 covers a whole portion wherein the first internal electrode 5 and the second internal electrode 6 are exposed on the surface of the device body 10. With this, it enables to prevent migration with more reliability. Further, the insulation layer may cover a whole portion wherein the internal electrodes are exposed (sides 10c and 10d of the device body 10 in FIG. 1). Furthermore, multiple insulation layers may be provided. Although the thickness of the insulation layer is not particularly limited, it is about 1 to 20 μm, for instance.

Materials of the insulation layer are not particularly limited, provided that they have high insulation properties, enable to prevent moisture intrusion and also enable to prevent migration between internal electrodes. For specific materials, resins, glasses and so on may be applicable. Further, for the electric resistance value of the insulation layers, although it is not particularly limited if it enables to ensure the insulation properties, it is preferable that the value is $10^9 \Omega$ or more in the present embodiment. Further, it is preferable that the insulation layer 7 does not include conductive particles and the like.

Resistance Layer 8

In the present embodiment, a resistance layer 8 is formed so that its both end contacts on the external electrodes (the first external electrode 5 and the second external electrode 6), and it physically and electrically connect the first external electrode 5 and the second external electrode 6, as shown in FIG. 1, With that the resistance layer 8 is formed, it enables to discharge electrical charges, generated from a polarization which is opposite to the direction of spontaneous polarization, by pyroelectric effect.

Generally, in the production process of the piezoelectric device, a polarization treatment is performed so that it becomes stretchable by applying voltage, and the direction of spontaneous polarization is determined. If such piezoelectric device is placed in an environment in which the temperature changes, a polarization is generated in a direction opposite to the spontaneous polarization by pyroelectric effect, particularly when the temperature declines. For the electrical charges generated from this polarization, it functions so as to cancel the electrical charges generated from spontaneous polarization. Therefore, the polarizability brought by spontaneous polarization decreases.

In the present embodiment, in order to suppress such decrease in polarizability, the electric charges generated by pyroelectric effect are discharged by connecting the resistance layer 8 between external electrodes having different polarities. It enables to discharge the electric charges generated by pyroelectric effect in the resistance layer without causing short circuit by the insulation layer, since the electric resistance value of the resistance layer 8 is lower than that of the insulation layer 7.

Further, in FIG. 3, it is not preferable that the resistance layer covers directly the a portion of the first internal electrodes 3a to 3c and the second internal electrodes 4a to 4c. The reason is there is a possibility that a short circuit is caused between internal electrodes having different polarities if the resistance layer covers directly the above part, since the electric resistance value of the resistance layer is lower than that of the insulation layer. Therefore, in the present embodiment, it is preferable that the resistance layer 8 does not directly cover the above part. Further, as shown in FIGS. 1 and 2, it is preferable that the insulation layer 7 exists between the portion wherein the internal electrodes 3, 4 are exposed on the surface of the device body 10 and the resistance layer 8.

Figure 4:
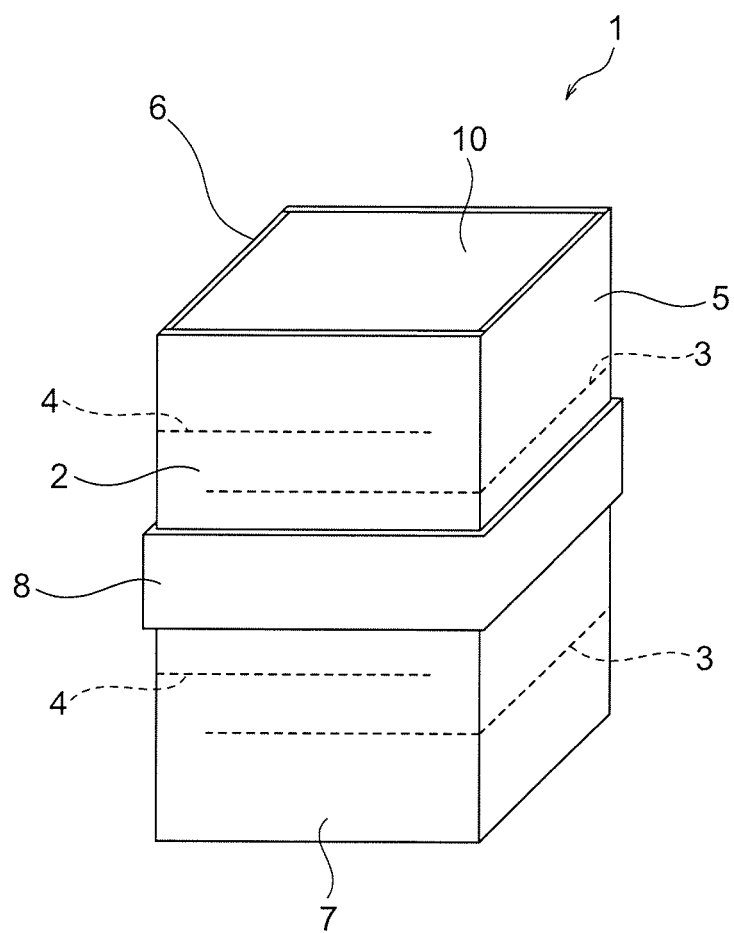
FIG. 4 is a schematic perspective view explaining the portion wherein a resistance layer is formed.
Figure 5:
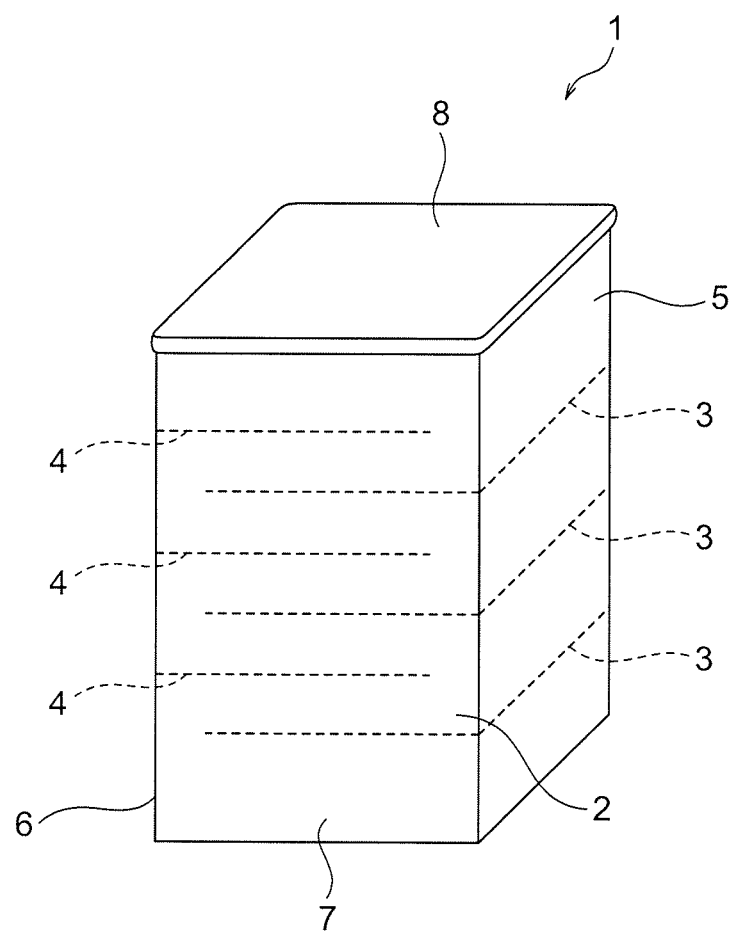
FIG. 5 is a schematic perspective view explaining the portion in which a resistance layer is formed.

The position where the resistance layer 8 is formed is not limited, provided that it is formed to electrically connect across external electrodes having different polarities. For instance, as shown in FIG. 4, the resistance layer 8 may be formed over the entire side surfaces of the device body 10. Further, as shown in FIG. 5, it may be formed on a portion of upper surface or lower surface and a part of each sides of the device body 10. Furthermore, multiple resistance layers may be provided. Although the thickness of the resistance layer is not particularly limited, it is about to 20 μm, for instance.

Materials of the resistance layer 8 are not particularly limited, provided that they have lower electric resistance value than the insulation layer and enable to discharge electric charges generated by pyroelectric effect. For specific materials, resins having a predetermined resistance value, insulating resins containing conductive particles such as carbon, and metal oxides and so on may be applicable. Further, the resistance layer may be formed by winding films having a predetermined electric resistance value on the sides of the device body. Further, the resistance layer may be formed by sputtered film and the like. Furthermore, it may be formed by including conductive particles and the like in the insulating resins and the like which are used in the insulation layer in order to lower the electric resistance value.

The electric resistance value of the resistance layer should be determined appropriately depends on the property of the piezoelectric device and the like. However, in the present embodiment, it is preferable that the electric resistance value is about $10^4$ to $10^8 \Omega$. The electric resistance value may be adjusted by changing the kinds of materials or combining multiple materials, and further, may be by changing measurements such as width and thickness of the resistance layer. In view of the above, in the present embodiment, it enables easily to adjust the electric resistance value of the resistance layer depending on a desired value.

As mentioned the above, in the present invention, the insulation layer that prevents migration and the resistance layer that suppresses the decrease in polarizability caused by pyroelectric effect are separately provided. With this, it enables to prevent migration with high reliability based on high insulation properties of the insulation layer. Further, it enables to discharge electric charges generated by pyroelectric effect with high reliablity even if fluctuation of electric resistance value is generated to some extent since it enables easily adjustment of the electric resistance value of the resistance layer. Therefore, it enables to enhance the reliability of the laminated piezoelectric device according to the present embodiment.

Figure 6:
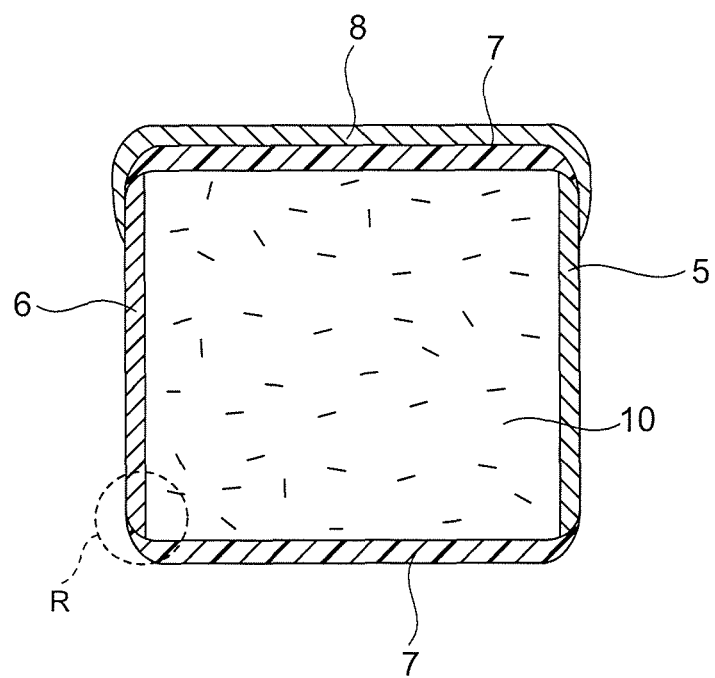
FIG. 6 is a schematic plane cross-sectional view showing a shape of edge line of the device body.

Although the shape of the device body 10 is not particularly limited, it is generally a cuboid. Further, as shown in FIG. 6, it is preferable that the corner and edge line of the cuboid are rounded off. With this, it enables easily to form the resistance layer in the production method of piezoelectric device described below.

Materials of the piezoelectric layer 2 are not particularly limited, provided that they show piezoelectric effect or inverse piezoelectric effect. For instance, $PbZr_xTi_{1-x}O_3$, $BaTiO_3$ and the like may be applicable. Further, components improving properties and the like may be included and the content should be appropriately determined depends on a desired properties.

The thickness of the piezoelectric layer 2 is not particularly limited. However, in the present embodiment, it is preferably about 5 to 50 μm. In the piezoelectric device according to the present embodiment, the resistance layer that suppresses the decrease of polarizability is provided separately from the insulation layer that prevents migration. With this, a short circuit between internal electrodes is not generated, even if a portion, where the electric resistance value is small, exists locally on the resistance layer. Therefore, it enables to prevent migration with high reliability even if the piezoelectric layers are thin.

Electrical conductive materials composing internal electrodes 3, 4 are not particularly limited. However, for instance, noble metals such as Ag, Pd, Au, Pt and the like and alloys of these (Ag—Pd and the like), or base metals such as Cu, Ni and the like and alloys of these may be applicable.

Materials of external electrodes 5, 6 are not particularly limited as well. Materials which are similar to the electrical conductive materials composing internal electrodes can be applied. Further, a plated layer and a sputtered layer of the above various metals may be formed on the outside.

Production Method for Laminated Piezoelectric Device

Next, the followings are explanation of a production method of laminated piezoelectric device according to the present embodiment. For the method of producing the laminated piezoelectric device, it is not particularly limited.

Although a publicly known method should be applied, the following explanation exemplifies the case using a sheet method.

First, green sheets on which the predetermined pattern internal electrode paste films that turn out to be first internal electrodes and second internal electrodes after firing are formed, and green sheets which do not have the internal electrode paste films are prepared.

The green sheets include the above mentioned materials composing the piezoelectric layers. Further, for the materials, they may include inevitable impurities.

Further, the green sheets are produced with the publicly known technology by using the above materials. Specifically, for instance, basic materials composing the piezoelectric layers are uniformly mixed by means of wet blending and the like, and then they are dried. Next, they are calcined under the firing condition which is appropriately selected, and then the calcined powders are wet-milled. Further, the crushed calcination powders are mixed with binders to be a slurry. Next, the slurry is made to be sheets by means of the doctor blade method or the screen printing method and the like, and then they are dried to obtain green sheets.

Next, by applying internal electrode paste including the above-mentioned electrical conductive materials to the surface of the green sheets by means of printing method and the like, it enables to obtain green sheets on which the predetermined pattern internal electrode paste films are formed.

Next, the above green sheets are overlapped and then adhered by adding pressure. Then, they are cut after the necessary process such as drying process and the like to obtain a substrate of green device body.

Next, the above substrate is fired under the predetermined condition to obtain a sintered body. After that, the sintered body is cut off into strip shape by using a dicing saw and the like. On the obtained strip-shaped sintered body, electrodes that turn out to be first external electrodes and second external electrodes are formed, and then a polarizing treatment is performed for the piezoelectric body by applying direct-current voltage to the above electrodes. Then, the strip-shaped sintered body after the polarizing treatment is cut off into individual device bodies to obtain device bodies wherein edge portions of internal electrodes are exposed on the sides. In the present embodiment, a barrel polishing is performed to the obtained device bodies so that R surface processing is performed to the corner and edge line of the device bodies.

Next, insulation layers are formed on the sides of device body to cover the portion where the internal electrodes are exposed. In the present embodiment, the insulation layers are formed by applying insulating resin. After forming the insulation layers, a resistance layer is formed. In the present embodiment, the resistance layer is formed by applying the insulating resin including conductive particles to the side of device body. Specifically, the resistance layer is formed on the insulation layer. At this moment, since the corner and edge line of the device body is rounded off, when the insulating resin including conductive particles is applied to the side of the device body with increased amount for instance, the resistance layer is formed so that a part of the insulating resin drops from the side, where the insulating resin is applied, to the other adjacent side to cover a part of the first external electrodes and second external electrodes as shown in FIG. 6. As a result, the resistance layers and the external electrodes are physically and electrically tightly joined. By going through the above processes, the laminated piezoelectric device 1 as shown in FIG. 1 can be obtained.

Thus, although the above is explanation about embodiments of the present invention, the present invention is not particularly limited to these embodiments and it is certain that it is possible to practice in various aspects without departing from the scope of the present invention.

For instance, the shape of device body is not limited to a cuboid and it may be a polygonal column and a circular column. Further, for instance, internal electrodes 3 shown in FIG. 3 may be pulled out so that their ends (the opposite side of junction with the external electrodes 5) are exposed on the surface of device body 10, and they may be exposed on the surface wherein the other internal electrode 4 and external electrode 6 are electrically connected. In this case, the exposed portion of the internal electrode 3 is covered with the insulating resin so that it does not cause a short circuit between the exposed edge portion of the internal electrode 3 and the external electrode 6. For other internal electrodes 4, they are the same with the above.

Further, the place where the external electrodes are formed is not particularly limited and they may be formed on the adjacent surface of each surface of the device body, provided that external electrodes and internal electrodes are electrically connected. Furthermore, multiple external electrodes having the identical polarities may be formed on the same surface, and also multiple external electrodes having different polarities may be formed on the same surface.

The resistance layers may be formed to cover the entire surface of device body including the insulation layers.

The invention claimed is:

1. A laminated piezoelectric actuator, comprising:
    a device body in which a number of piezoelectric layers, first internal electrodes and second internal electrodes having different polarities from the first internal electrodes are laminated;
    a first external electrode electrically connected to the first internal electrodes and formed on the surface of the device body;
    a second external electrode electrically connected to the second internal electrodes and formed on the surface of the device body;
    an insulation layer covering at least a portion of the external surface of the stack wherein both the first internal electrodes and the second internal electrodes are exposed on the surface of the device body, where mechanical displacement is generated by applying voltage; and
    a resistance layer separately formed from the instulation layer to electrically connect the first external electrode and the second external electrode, wherein the resistance layer has a lower electric resistance value than the insulation layer and covers at least a portion of at least one of the first external electrodes and the second external electrodes.

2. The laminated piezoelectric actuator as set forth in claim 1, wherein
    the resistance layer does not contact with the first internal electrodes and the second internal electrodes.

3. The laminated piezoelectric actuator as set forth in claim 1, wherein the resistance layer comprises insulating resins containing conductive particles.

4. The laminated piezoelectric actuator as set forth in claim 3, wherein the insulation layer is free of conductive particles.

* * * * *